US012392825B2

(12) United States Patent
McQuilkin (10) Patent No.: US 12,392,825 B2
(45) Date of Patent: Aug. 19, 2025

(54) CONFIGURABLE PIN DRIVER CIRCUIT OUTPUT IMPEDANCE

(71) Applicant: Analog Devices, Inc., Wilmington, MA (US)

(72) Inventor: Christopher C. McQuilkin, Hollis, NH (US)

(73) Assignee: Analog Devices, Inc., Wilmington, MA (US)

( * ) Notice: Subject to any disclaimer, the term of this patent is extended or adjusted under 35 U.S.C. 154(b) by 158 days.

(21) Appl. No.: 18/211,481

(22) Filed: Jun. 19, 2023

(65) Prior Publication Data

US 2024/0418777 A1    Dec. 19, 2024

(51) Int. Cl.
*G01R 31/26* (2020.01)
*G01R 31/319* (2006.01)

(52) U.S. Cl.
CPC .   *G01R 31/31905* (2013.01); *G01R 31/31908* (2013.01); *G01R 31/31924* (2013.01)

(58) Field of Classification Search
CPC ........ G01R 31/31905; G01R 31/31908; G01R 31/31924
See application file for complete search history.

(56) References Cited

U.S. PATENT DOCUMENTS

| | | | |
|---|---|---|---|
| 11,128,287 B1* | 9/2021 | McQuilkin | G11C 29/56012 |
| 2017/0102724 A1* | 4/2017 | Petenyi | G05F 1/575 |
| 2017/0324386 A1* | 11/2017 | Schemmann | H03F 3/26 |
| 2022/0131505 A1* | 4/2022 | Snai | H03F 1/26 |

\* cited by examiner

*Primary Examiner* — Thang X Le
(74) *Attorney, Agent, or Firm* — Schwegman Lundberg & Woessner, P.A.

(57) ABSTRACT

A test system can provide a test signal to, or receive a test signal from, a device under test (DUT) via a first signal path. The test system can be configured to present a stable (e.g., 50 ohm) impedance at the DUT interface. In an example, the stable impedance comprises a physical polysilicon resistor in series with an output stage of a driver circuit of the test system. The impedance of the output stage can be a function of an incremental impedance of transistors in a push-pull output circuit. In an example, a control loop is provided to change a bias condition for the transistors to adjust the impedance of the output stage.

20 Claims, 6 Drawing Sheets

CONFIGURABLE PIN DRIVER CIRCUIT OUTPUT IMPEDANCE

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a 50 ohm resistor, which is then connected to the DUT node. Transitions between the three levels can be realized by opening and closing the appropriate switches, such as with only one switch closed at any given time.

BRIEF SUMMARY

The present inventors have recognized, among other things, that a problem to be solved includes providing an automated test system to deliver test signals to, and measure response signals from, a device under test (DUT). The problem can include providing a system that is relatively small, inexpensive to produce, consumes little power, or provides higher fidelity performance relative to prior systems.

In an example, the problem can include maintaining a stable and known impedance characteristic at the DUT interface of the test system. By convention, an ideal impedance characteristic at the DUT interface can be 50 ohms, however other conventions or impedance values can be used for particular tests or devices. If a stable or known impedance characteristic is not maintained, then DUT signals can become degraded or corrupted. For example, sources of corruption can include skin effect losses, dielectric loading, conductor resistance and waveform reflections, and more. Such signal corruption sources can contribute to undesirable changes to a DUT signal when the signal travels between the DUT and, for example, a comparator configured to measure changes in the DUT signal. The undesirable changes in the DUT signal can contribute to signal timing errors due to propagation delays or transmission line effects that, in turn, can lead to false or erroneous test results.

The present inventor has recognized that providing a physical 50 ohm output resistor at the DUT interface is inadequate in some scenarios and impractical in others. The present inventor has further recognized that the impedance at the DUT interface is a function of multiple elements of the output stage of the test system, including an "incremental impedance" of transistors that comprise the output stage of the test system.

In an example, a solution to these and other problems can include or use a test system comprising a comparator circuit coupled to a DUT node, an active load coupled to the DUT node, and an output stage circuit coupled to the DUT node. The output stage circuit can be configured to provide, at the DUT node, a specified impedance characteristic that is substantially invariant over a specified range of DUT currents. In an example, the output stage circuit includes a class AB driver circuit that includes output transistors provided in a push-pull configuration. The output stage circuit can further include a bias current controller configured provide, based on a first control input, a bias current for the output transistors of the driver circuit. In an example, the output stage circuit further includes a feedback controller configured to provide, based on a second control input, a feedback current at respective base terminals of the output transistors of the driver circuit. A magnitude of the feedback current can be based on the DUT current. A user or other control system can provide control signals to the first and second control inputs to adjust the impedance of the output stage and thereby achieve a more precise impedance characteristic, or optimal impedance characteristic, at the DUT interface.

In an example, a solution to the above-mentioned problems can include a method for adjusting a characteristic output impedance of an output stage of a pin driver circuit. The method can include receiving a first control input at a bias current controller and, in response, providing a bias current to transistors in the output stage of the pin driver circuit. A magnitude of the bias current can correspond to a value of the first control input. The method can further include receiving a second control input at a feedback controller and, in response, providing a feedback current at respective base terminals of the transistors in the output stage of the pin driver circuit. A magnitude of the feedback current can correspond to a value of the second control input. In this example, the characteristic output impedance of the output stage corresponds to an impedance at an output node that is coupled to emitter terminals of the transistors in the output stage.

This summary is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A pin driver circuit of a test system can provide a voltage pulse stimulus to a device under test (DUT) at a specified time, and optionally can measure a response signal from the DUT. The test system can be configured to provide high fidelity output signal pulses over a relatively large output signal magnitude range to accommodate different tests and different types of devices under test.

In an example, a test system can include a pin driver architecture that can provide high fidelity stimulus signals with minimal overshoot or spiking of high frequency signals, and can enhance pulse edge placement accuracy and signal bandwidth at high or low power operating levels. In an example, a test system can include one or more driver stages, such as can include a class A driver stage or a class AB driver stage, such as can be configured to provide a variety of pulse signals. The systems can include control circuits to precisely adjust switching voltage signals and switching current signals, and to control an operating mode and monitoring or measuring activity of a comparator.

In an example, multiple drivers or driver stages can be used to provide a test system that is configurable to test a variety of semiconductor devices with varying voltage and speed requirements. Furthermore, multiple drivers can be used to enhance or enable multiple signal level testing or "multiplexing" for physical layer testing. During physical layer testing, the multiple drivers can be switched concurrently to provide various stimuli or drive signals to a DUT.

In an example, a pin driver stage of a test system comprises a portion of the interface between the tester and the DUT. The pin driver stage can be responsible for establishing the timing accuracy of the test system. That is, the pin driver stage can be configured to precisely deliver DUT stimulus signal edges substantially independently of environmental or other factors. In some examples, the pin driver stage is configured to support higher frequency, lower voltage current stimulus signals, and lower frequency, higher voltage stimulus signals. In an example, the pin driver stage maintains a particular characteristic impedance (e.g., 50 ohms) that is optimized for bandwidth and timing accuracy. The characteristic impedance can be matched to, for example, an impedance of a transmission line that couples the test system to the DUT.

A test system can include a comparator circuit or comparator stage that is configured to receive high speed voltage or current response signals from a DUT. A comparator, generally, is a decision element that provides information about a relationship between at least two input signals. For example, a comparator can provide a digital output (e.g., a logic high or a logic low signal) that indicates a relationship between a signal from a DUT and a reference signal, such as a reference voltage signal. The comparator can include one or more gain stages, such as can be coupled in series, to yield a high gain response.

In some examples, high speed automatic test equipment (ATE) systems have sufficiently high bandwidth that non-idealities in the transmission medium between the device under test (DUT) and the ATE pin electronics can limit overall system performance. This transmission medium, or path, generally comprises several cables, connectors, printed circuit board traces and "pogo pins" that electrically couple with the DUT. The losses associated with such components primarily manifest as the "skin effect" in which the resistance seen by the propagating signal is a function of signal frequency. Because every signal can be represented by a superposition of many frequency components, certain components of the signal suffer greater loss than others, thus producing a dispersive effect that degrades the signals communicated with the DUT. If the original signal is to be presented to the pin electronics with minimal distortion, then great care must be taken in the design of the transmission path. In some cases, the frequency components present in high speed signals are so high that even the best quality transmission path can cause significant degradation in the signal integrity. In such cases the pin electronics receiver, typically a comparator, can include or use compensation circuitry to compensate for the expected transmission losses.

Figure 1:
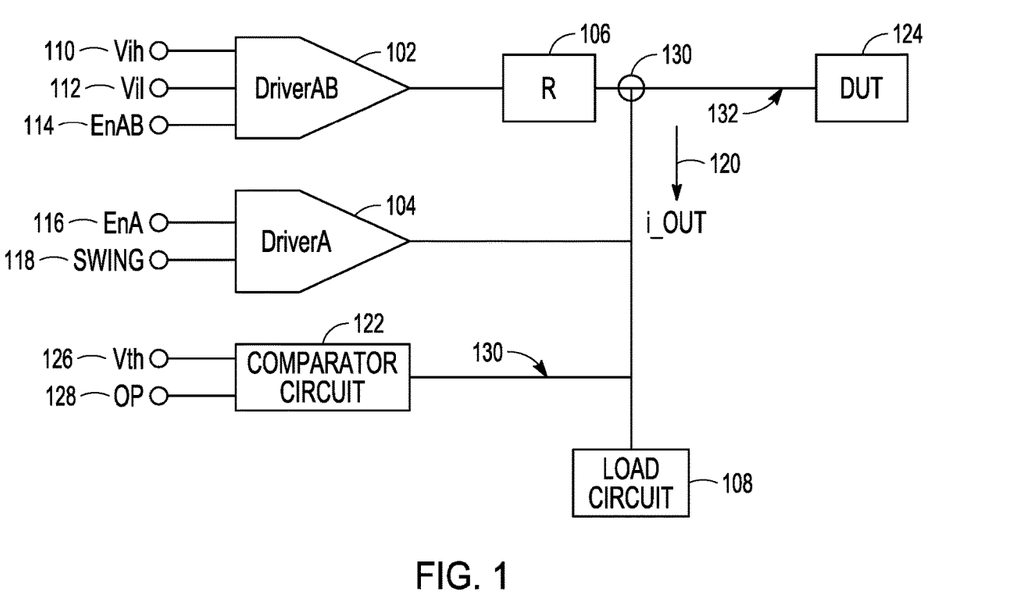
FIG. 1 illustrates generally an example of a first test system that includes a pin driver.

FIG. 1 illustrates generally a first example test system 100 showing a test system topology that includes multiple driver stages, a load, and a comparator stage. The first example test system 100 includes a driver system comprising a first DriverAB 102 that can include a class AB driver circuit, and a first DriverA 104 that can include a class A driver circuit. The first example test system 100 can further include an output element such as a first resistor 106 that can be configured to provide a specified output or load impedance. In an example, the first example test system 100 includes a comparator circuit 122, or a first load circuit 108, such as can include an active load or other loading device. In an example, the test system is configured to provide a first output current 120, i_OUT, at a DUT interface or DUT node 130. The DUT node 130 can be coupled to a DUT 124 using a loaded signal path 132. In some examples, the first resistor 106 and the loaded signal path 132 have matching impedance characteristics.

In an example, the first DriverAB 102 can be configured to produce a voltage stimulus signal by selecting between parallel-connected diode bridges with each bridge driven by a unique, dedicated DC voltage level. In the first example test system 100 of FIG. 1, DC voltages Vih 110 and Vil 112 drive diode bridges in the first DriverAB 102. The switching stage can be followed by a voltage buffering stage that can provide power gain, such as can be used to produce large currents to serve a 50 ohm DUT environment.

In contrast with the first DriverAB 102, the first DriverA 104 can be configured to produce transitions at the DUT node 130 using a relatively large current switch stage that can be coupled directly to the DUT node 130. A current switching stage in the first DriverA 104 can alternately switch current into and out of the DUT node 130 in response to a control signal Swing 118, such as can be a voltage control signal. The first DriverA 104 can provide high speed operation, for example, because it may be unburdened by the class AB voltage buffering stage with its attendant bandwidth limitations and other performance limitations.

In an example, the first DriverA 104 can be configured to provide a relatively low amplitude signal at the DUT node 130. For example, the first DriverA 104 can provide a signal having about a 2 volt swing. The first DriverAB 102 can be configured to provide a relatively high amplitude signal at the DUT node 130, for example, −1.5 to +7 volts. The first DriverA 104 generally operates at a higher switching speed or bandwidth than the first DriverAB 102. In an example, the first DriverAB 102 can be configured to absorb switching currents from the first DriverA 104. That is, the first DriverAB 102 can serve as a buffer that the first DriverA 104 can source current into, such as through the first resistor 106.

One or both of the first DriverAB 102 and the first DriverA 104 can be selected to fulfill disparate DUT test requirements that may not otherwise be fulfilled by a single driver. For example, while both driver circuits can provide DUT waveforms, the first DriverAB 102 can be configured to provide larger amplitude, lower bandwidth stimulus signals, and the first DriverA 104 can be configured to provide lower amplitude, higher bandwidth stimulus signals. In other examples, a single driver (e.g., the first DriverAB 102) can be used.

In an example, the first DriverAB 102 and the first DriverA 104 do not share an enable pin. Instead, each driver circuit includes an independent enable control through pins EnAB 114 and EnA 116. The independent enable control facilitates the first DriverAB 102 to serve as a low speed, high voltage stimulus source, and to serve as a static, non-transitioning buffer to absorb switching currents from the first DriverA 104.

FIG. 1 includes the comparator circuit 122. The comparator circuit 122 can include a single-stage or multiple-stage comparator that is configured to receive a signal from the DUT 124, such as via the DUT node 130 and the loaded signal path 132. The comparator circuit 122 can compare the received signals to a comparator reference signal 126 (e.g., Vth) and, in response, provide a differential comparator output signal 128 (e.g., OP). For example, the comparator circuit 122 can receive a voltage response signal from the DUT 124 and compare an amplitude of the voltage response signal to an amplitude of the comparator reference signal 126. The comparator circuit 122 can provide information about the amplitude relationship using the differential comparator output signal 128, such as can include a digital signal or logic output signal.

Figure 2:
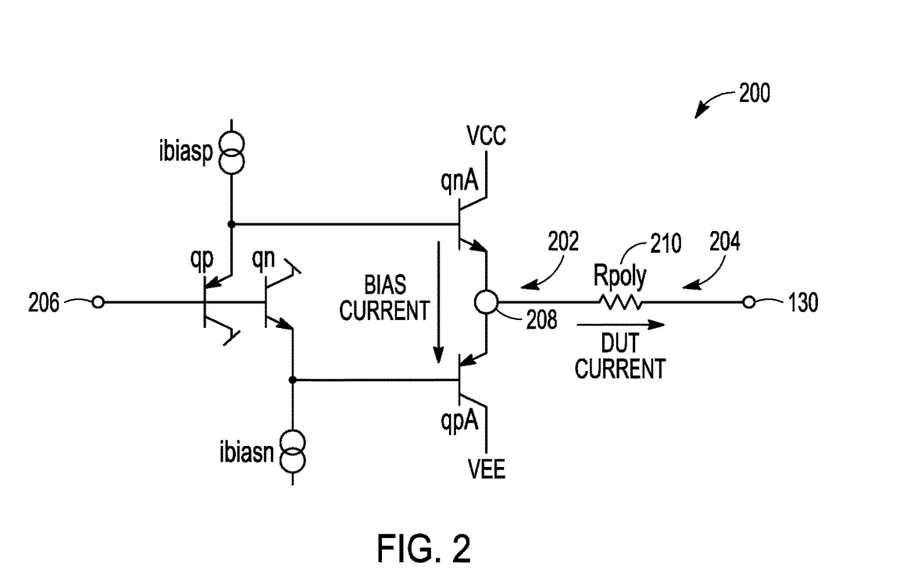
FIG. 2 illustrates generally an example of an output stage of a pin driver.

FIG. 2 illustrates generally an example of a simplified output stage 200 for a pin driver, such as can include an output stage of the first DriverAB 102. The simplified output stage 200 comprises a buffer that receives a switching voltage signal at a voltage input node 206 and provides a buffered representation of the switching voltage signal at the DUT node 130. Resistance, inductance, and capacitance characteristics of the buffer create an output stage characteristic impedance, or driver output impedance 204 that is presented at the DUT node 130. In an example, the total driver output impedance 204 is a function of an output resistor 210 and a characteristic incremental impedance or AB stage output impedance 202 of the driver. For example, the driver output impedance 204 can be represented by the series combination of the resistance of the output resistor 210 and a bias current-dependent impedance of the transistor devices that are coupled to the output of the driver.

The simplified output stage 200 includes a network of devices including push-pull output transistors qnA and qpA and reference path transistors qp and qn. In the example of FIG. 2, a first current source ibiasp provides a current signal at an emitter of the reference path transistor qp and a second current source ibiasn provides a current signal at an emitter of the reference path transistor qn. The reference path transistors are coupled to the voltage input node 206 to receive the switching voltage signal, to thereby control the current in the reference path transistors.

The output transistors qnA and qpA comprise NPN and PNP devices (or arrays of such devices), respectively, coupled in series between a voltage source VCC and voltage reference VEE. The emitters of the output transistors qnA and qpA are coupled at an intermediate output node 208. In an example, the intermediate output node 208 is coupled to the DUT node 130 via an output resistor 210, Rpoly, such as can comprise a fixed-value polysilicon (or other) resistor. In this example, the driver output impedance 204 can be represented by the series combination of the AB stage output impedance 202, such as at the intermediate output node 208, and the output resistor 210.

In an example, the impedance or resistance characteristic of the output resistor 210 can be controlled in various ways. For example, the output resistor 210 can be a laser-trimmed thin film resistor device whose value is permanently set at the point of manufacture. However, the laser trimming process can be expensive or impractical in some fabrication processes, and large resistors can add undesirable capacitive effects. In another example, the output resistor 210 can comprise an array of devices (e.g., MOSFET switches or other devices) having an impedance characteristic that depends on the number of parallel devices that are enabled or disabled. This solution can have inadequate bandwidth or voltage characteristics and relatively significant temperature dependence. In still another example, the output resistor 210 can comprise multiple parallel resistors and the impedance characteristic of the parallel combination can be adjusted by switching various legs of the resistor network in or out of the DUT current signal path. This solution can be problematic at high switching frequencies, such as due to parasitic capacitance effects associated with switches in each resistor leg. In an example that includes MOS-based switches, a DUT voltage range can be constrained to avoid damaging the MOS devices with voltages outside of a predetermined safe operating area envelope. A different solution is needed to ensure a stable (e.g., 50 ohm) output impedance characteristic for the output stage of a pin driver.

In an example, a difference in voltage between the bases of the push-pull output transistors qnA and qpA establishes a bias current through the transistors. To accommodate higher bandwidth or faster output signals at the DUT node 130, the first and second current sources ibiasp and ibiasn can provide larger current signals, and in turn the output transistors qnA and qpA can be physically large (or can comprise respective combinations of parallel-coupled smaller devices, or arrays). Using a large bias current signal, however, affects the AB stage output impedance 202 of the driver. In some examples, the influence of the bias current on the AB stage output impedance 202 is significant and causes a mismatch between the impedance at the DUT node 130 and the DUT, and the transmission line coupled to the DUT node 130, which in turn can lead to poor performance and timing errors. In other words, if impedance characteristics at the DUT node 130 and the DUT are not matched, then signal aberrations due to reflections can be introduced in the signal path and degrade timing accuracy and therefore degrade test system performance.

In an example, the bias current can be controlled to correspondingly adjust or control the AB stage output impedance 202 and thus the driver output impedance 204 for the class AB output stage. For example, during operation in the non-saturating region, a bipolar transistor incremental emitter impedance (herein, re) can depend on current and temperature, for example, $re=KT/q/Ie$, where T is temperature, k is Boltzmann's constant, q is the electron charge, and Ie is the bias current flowing through the device. At room temperature, re is about 25 mV/Ie. In other words, the output impedance of a bipolar transistor is a function of the bias current in the device. This resistance/current relationship can be exploited to change the output impedance of a transistor used in an output stage, such as to change the AB stage output impedance 202. For example, by differentiating the emitter impedance function, it can shown that the output impedance decreases linearly with respect to increases in bias current. Therefore, by intentionally changing the bias current, the output impedance can be controlled.

Figure 3:
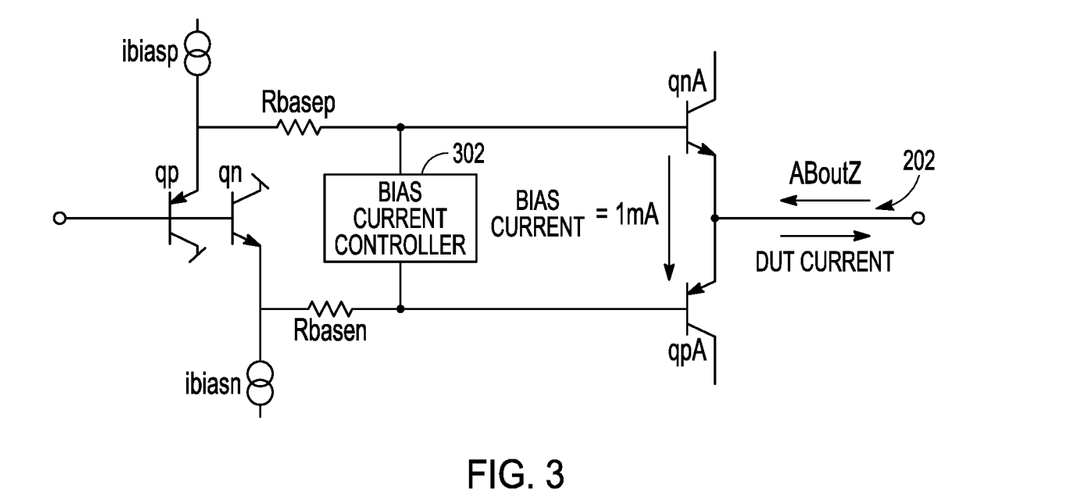
FIG. 3 illustrates generally an example of a pin driver output stage with a bias current controller.

FIG. 3 illustrates generally an example of the simplified output stage 200 with a bias current controller 302 and base resistors associated with the output transistors. The bias current controller 302 can be configured to change a voltage differential between the bases of the push-pull output transistors qnA and qpA to thereby change a magnitude of the bias current in the transistors. The magnitude of the bias current influences the AB stage output impedance 202, or AB out Z, as described above. In an example, the bias current controller 302 establishes the voltage differential in part by souring or sinking a current through base resistors Rbasep and Rbasen that are coupled to the output transistors qnA and qpA, respectively.

In the example of FIG. 3, the bias current controller 302 establishes a 1 mA bias current, Ie, in the output transistors qnA and qpA. When the bias current is 1 mA, the emitter impedance at each of the output transistors is given by $$re = \frac{kT}{q}/Ie = \frac{25 \text{ mV}}{1 \text{ mA}} = 25\Omega.$$

The AB stage output impedance 202 comprises the parallel combination of the output transistors qnA and qpA and, accordingly, the AB stage output impedance 202 can be calculated to be 12.5 ohms, such as when the DUT current is zero (i.e., when the driver is not sourcing or sinking current to the DUT node 130).

Figure 4:
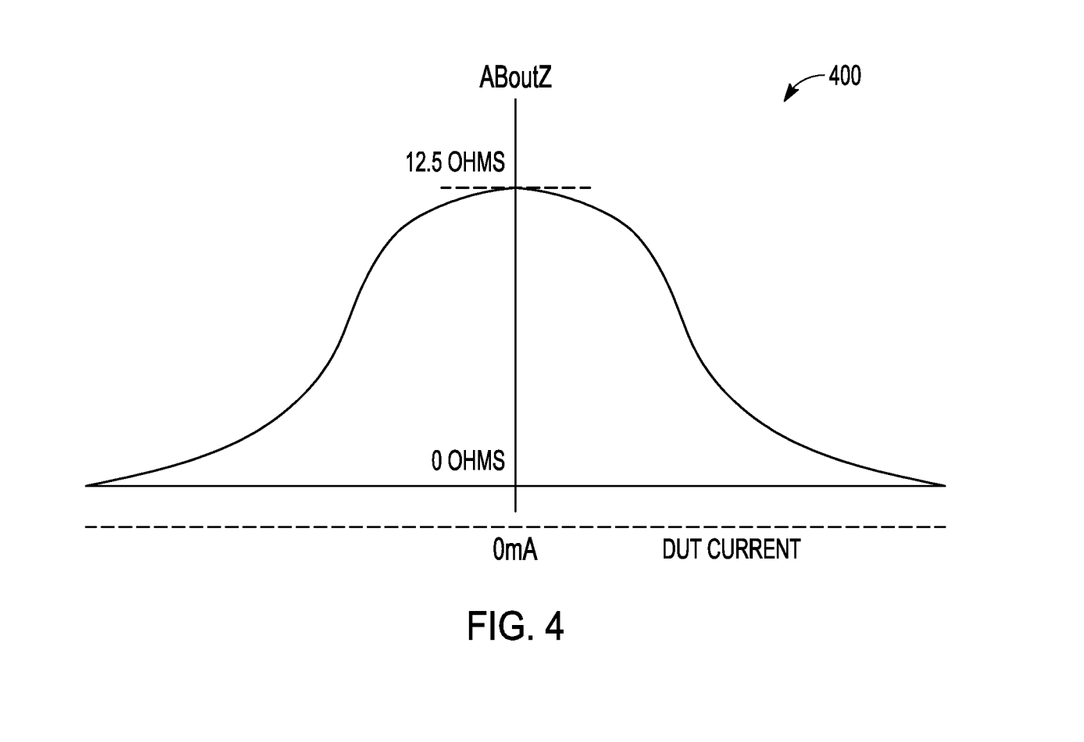
FIG. 4 illustrates a first chart showing a relationship between DUT current and output stage impedance.

FIG. 4 illustrates generally a first chart 400 showing a relationship between DUT current at the DUT node 130 and the AB stage output impedance 202, such as for the simplified output stage 200. The first chart 400 shows generally that the AB stage output impedance 202 decreases as the absolute magnitude of the DUT current increases. At high currents (sinking or sourcing) at the DUT node 130, the AB stage output impedance 202 approaches zero. At intermediate DUT currents, the AB stage output impedance 202 is between about zero and 12.5 ohms.

In an example, if the bias current is increased to 2 mA, then the emitter impedance $$re = \frac{kT}{q}/Ie = \frac{25 \text{ mV}}{2 \text{ mA}} = 12.5\Omega$$

for each of the output transistors. In this example, the AB stage output impedance 202 comprises the parallel combination of the output transistors provides the AB stage output impedance 202 at 6.25 ohms, such as when the DUT current is zero (i.e., when the driver is not sourcing or sinking current to the DUT node 130).

Based on the relationship between bias current in the output transistors and the AB stage output impedance 202, a feedback or control loop can thus be provided to establish a bias current to achieve an adjustable impedance characteristic for the pin driver. In an example, the bias current can be used to help mitigate or accommodate the effects of variations in the resistance value of the output resistor 210. For example, the output resistor 210 can comprise a thin film resistor with some degree of resistance variability due to manufacturing variation (e.g., +/−1%, or +/−5%, or +/−10%, or other variation). The variability in the output resistor 210 can be accounted by for adjusting the bias current in the output transistors to thereby change the AB stage output impedance 202 that is coupled to the output resistor 210.

For example, to ensure a 50 ohm load from the perspective of the DUT at the DUT node 130, the pin driver can present a 50 ohm load that is a series combination of the output resistor 210 and the AB stage output impedance 202. If the resistance of the output resistor 210 is, for example, about 44 ohms, then the bias current provided to the output transistors qnA and qpA can be set by the bias current controller 302 to be about 2 mA such that at zero DUT current, the driver output impedance 204 is the series combination of the 6.25 ohm incremental impedance of the transistors and the 44 ohm physical resistor resistance, or about 50 ohms.

Figure 5:
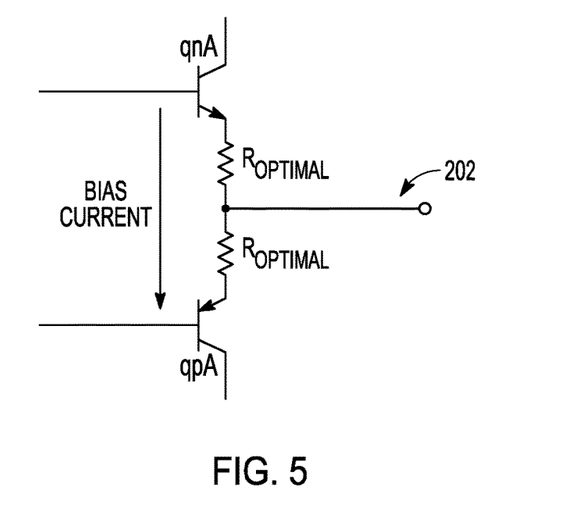
FIG. 5 illustrates generally an example of a portion of a pin driver output stage with degeneration resistors.

The present inventor has recognized that the AB stage output impedance 202 of the push-pull output stage can be made substantially insensitive to DUT current by providing an emitter resistor in series with the output transistors qnA and qpA. FIG. 5 illustrates generally an example of a portion of the simplified output stage 200 with emitter resistors, or degeneration resistors, coupled to the emitter terminals of the output transistors qnA and qpA. In the example of FIG. 5, the emitter resistors have the same resistance characteristic $R_{OPTIMAL}$. The designation of "optimal" can refer to a value of each of the emitter resistors that is chosen to be about the same or equal to the output transistor incremental impedance when the current magnitude at the DUT node 130 is zero (i.e., when the DUT node 130 is not sourcing or sinking current to the DUT).

Figure 6:
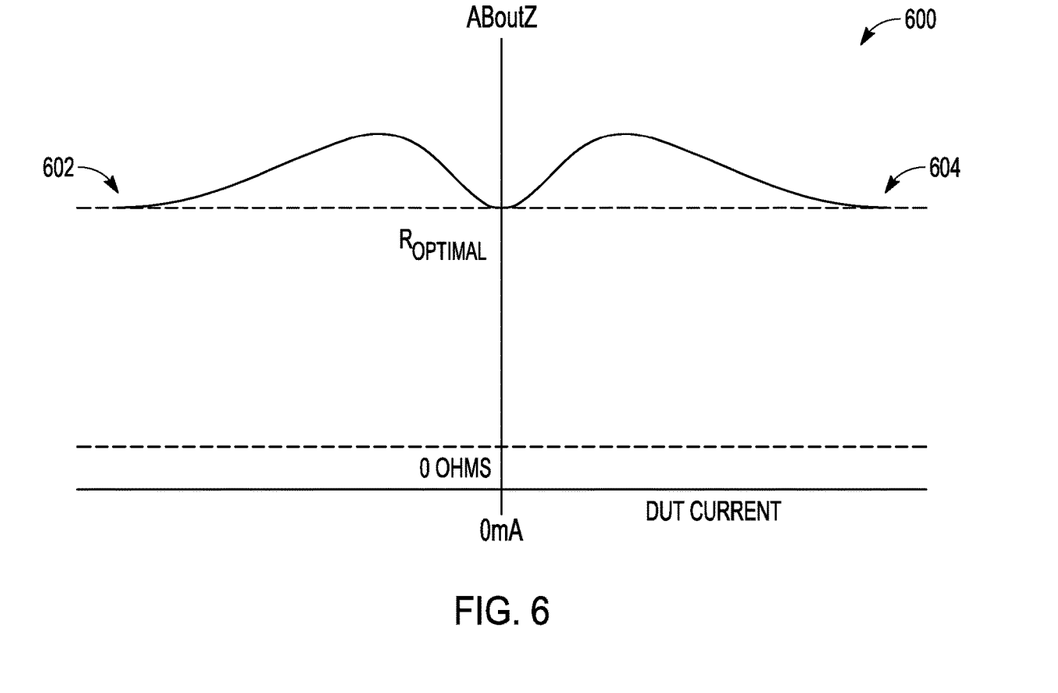
FIG. 6 illustrates a second chart showing a relationship between DUT current and output stage impedance.

FIG. 6 illustrates generally an example of a second chart 600 showing a relationship between DUT current and the AB stage output impedance 202, such as for the simplified output stage 200 with emitter resistors from the example of FIG. 5. In an example that includes degeneration resistors having the "optimum" value described above, the second chart 600 shows generally that the AB stage output impedance 202 increases nominally as the DUT current increases from zero, but then settles at or near $R_{OPTIMAL}$. That is, at high currents (sinking or sourcing) at the DUT node 130, the AB stage output impedance 202 approaches $R_{OPTIMAL}$. For example, in a fully commutated DUT current sourcing 602 state, where all of the DUT current is supplied by the NPN transistor qnA, the AB stage output impedance 202 is $R_{OPTIMAL}$. Similarly, in a fully commutated DUT current sinking 604 state where all of the DUT current is sunk by the PNP transistor qpA, the AB stage output impedance 202 is $R_{OPTIMAL}$. Thus, the inclusion of the degeneration resistors at the emitters of the output transistors helps stabilize the AB stage output impedance 202 for most of the DUT current operating range and enables the AB stage output impedance 202 to be substantially independent of DUT current.

In a particular example, assume the incremental impedance of each of the output stage transistors is 25 ohms, which in turn makes $R_{OPTIMAL}$ to be 25 ohms for each of the degeneration resistors. In this example, the series combination of the incremental impedance of NPN transistor qnA and its degeneration resistor is 50 ohms, and the series combination of the incremental impedance of the PNP transistor qpA and its degeneration resistor is 50 ohms. The parallel combination of such impedances is thus 25 ohms at the AB stage output impedance 202. If the driver supplies a large DUT current, then the PNP transistor qpA is effectively turned off and all of the DUT current flows through the NPN transistor qnA. The effective impedance, or incremental impedance, of the transistor qnA is small in this case. Likewise, if the driver receives or sinks a large DUT current, then the NPN transistor qnA is effectively turned off and all of the DUT current flows through the PNP transistor qpA.

In an example, a high-speed feedback circuit can be provided to work together with the bias current controller feedback loop. The high-speed feedback circuit can be configured to impose a user-configurable amount of output current on the base resistors Rbasep and Rbasen, thus effectively transforming the base resistors into emitter degeneration resistors. The base resistors can remain physically coupled to the bases of the output transistors, the high-speed feedback action makes them appear as if they are in series with the output stage resistors.

In an example, the bias current controller 302 is a lower-bandwidth control loop that provides a user-specified amount of bias current to the output transistors to compensate for uncertainty or variability in the resistance of the output resistor 210. The higher-bandwidth control loop provides a feedback signal that imposes a user-specified amount of feedback current on the base resistors of the output transistors, such as to "transform" the base resistors into emitter degeneration resistors having the optimum resistance value, as described above, thereby effectively changing the emitter degeneration behavior of the output transistors and changing the AB stage output impedance 202. In other words, changing the emitter degeneration behavior of the output stage establishes an optimal state that makes the driver output impedance substantially independent of DUT current.

Figure 7:
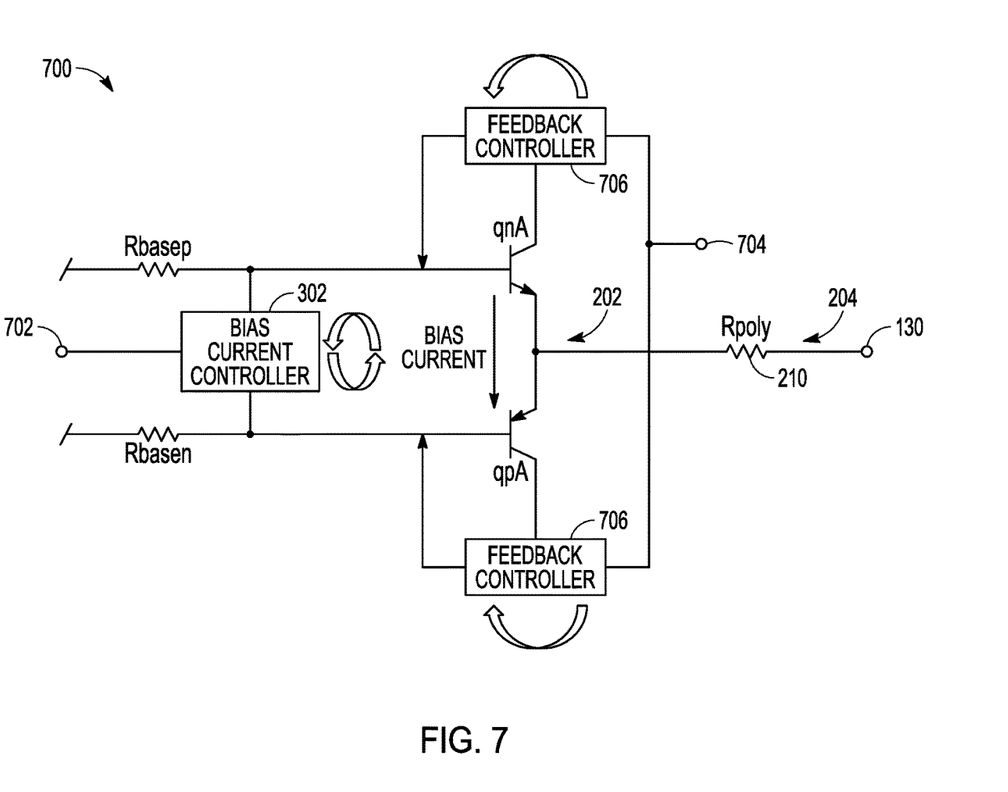
FIG. 7 illustrates generally a first example of a pin driver output stage with a bias current controller and a feedback controller.

FIG. 7 illustrates generally a first example of a pin driver output stage with a bias current controller and a feedback controller. The example of FIG. 7 includes a first compensated output stage 700 that can include the bias current controller 302 and a feedback controller 706. The bias current controller 302 can be configured to control the differential voltage across the bases of the output transistors qnA and qpA to establish a controlled bias current through the output transistors. The feedback controller 706 can be configured to control feedback current signals that are respectively imposed on base resistors Rbasep and Rbasen. The bias current controller 302 and the feedback controller 706 establish the AB stage output impedance 202 of the first compensated output stage 700, and help ensure the driver output impedance 204 is optimally valued to maximize signal fidelity.

In an example, the bias current controller 302 is configured to receive a tuning parameter such as a first control signal at a first control input 702. The first control signal can include, for example, an analog or digital control signal that defines a magnitude of the differential voltage to impose at the bases of the output transistors, which in turn defines a magnitude of the bias current in the transistors. In an example, the first control signal is set or provided by a user, or is updated automatically by other aspects of the test system that includes the first compensated output stage 700. In an example, the bias current controller 302 comprises a scaled-down replica circuit representative of, or corresponding to, the output stage circuit.

In an example, the feedback controller 706 is configured to receive another tuning parameter such as a second control signal at a second control input 704. The second control signal can include, for example, an analog or digital control signal that defines a magnitude of a current signal to impose at the bases of the output transistors, which in turn defines a magnitude of a voltage established at the base resistors Rbasep and Rbasen. In an example, the second control signal is set or provided by a user, or is updated automatically by other aspects of the test system that includes the first compensated output stage 700. In an example, using the feedback controller 706 to impose a current signal at the base resistors is electrically similar to providing degeneration or emitter resistors at the emitters of the output transistors qnA and qpA. In some examples, the feedback controller 706 can be used to impose the current signals at the base resistors, and degeneration or emitter resistors can also be provided.

In an example, an optimum state of the output stage occurs when the current signals supplied by the feedback controller 706, which are imposed on the first and second base resistors, creates a voltage that is substantially equal to the voltage created by the DUT current at the DUT node 130, thereby producing a driver output impedance 204 that is substantially independent of the DUT current. In this example, the DUT current can be a bidirectional current signal that is imposed on the AB stage output impedance 202, or effective impedance of the push-pull output transistors of the output stage.

In an example, when the first control signal at the first control input 702 indicates a minimum bias current for the output transistors qnA and qpA of the first compensated output stage 700, the second control signal at the second control input 704 can indicate a minimum feedback current to thereby maintain or optimize the AB stage output impedance 202 for a particular DUT current. In some examples, the first control signal can be a function of the second control signal, or the second control signal can be a function of the first control signal.

Figure 8:
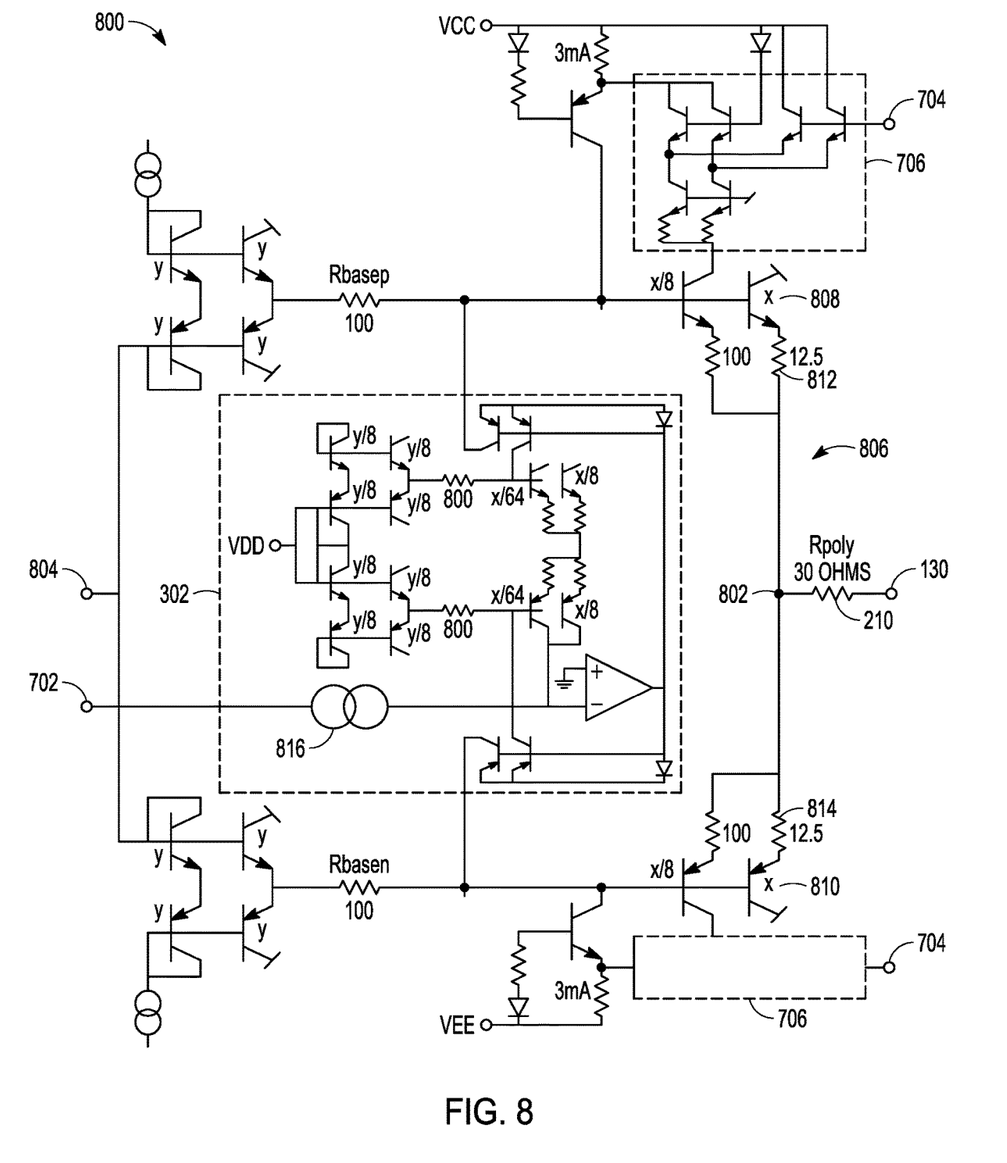
FIG. 8 illustrates generally a second example of a pin driver output stage with a bias current controller and a feedback controller.

FIG. 8 illustrates generally a second example of a pin driver output stage 800 such as can comprise a portion of the first DriverAB 102 or the first example test system 100. The output stage 800 can correspond generally to the simplified output stage 200 or the first compensated output stage 700 from the examples of FIG. 2 and FIG. 7, respectively. For example, the output stage 800 can include an intermediate output node 802 that is coupled to the DUT node 130 using the output resistor 210. The output stage 800 presents an adjustable output impedance at the intermediate output node 802. For example, the output impedance of the output stage 800 can be changed based on a magnitude of the DUT current at the DUT node 130.

The output stage 800 in the example of FIG. 8 includes an input node 804 that is configured to receive a switching voltage signal. The switching voltage signal is buffered or amplified by the output stage 800 and provided to the DUT node 130 using a push-pull output stage circuit 806 that includes the intermediate output node 802.

The push-pull output stage circuit 806 comprises a first output transistor 808 (e.g., an NPN transistor) and a second output transistor 810 (e.g., a PNP transistor). The first output transistor 808 and second output transistor 810 can optionally comprise respective arrays of similarly configured transistors. In an example, a first degeneration resistor 812 is coupled to the emitter of the first output transistor 808 and a second degeneration resistor 814 is coupled to the emitter of the second output transistor 810. The first degeneration resistor 812 and the second degeneration resistor 814 can be coupled at the intermediate output node 802. The intermediate output node 802 can be coupled to a DUT at the DUT node 130 via the output resistor 210. In an example, the first output transistor 808 corresponds to the output transistor array qnA and the second output transistor 810 corresponds to the output transistor array qpA from the earlier-described examples of various output stages for a pin driver.

The output stage 800 further includes an example of the bias current controller 302, such as coupled between the bases of the first output transistor 808 and the second output transistor 810. The bias current controller 302 establishes a differential voltage between the bases of the output transistors to thereby control a magnitude of a bias current that flows through the push-pull output stage circuit 806 and correspondingly changes an impedance characteristic of the push-pull output stage circuit 806. That is, the bias current influences the incremental impedance of the first output transistor 808 and the second output transistor 810 that in turn affects the output impedance of the output stage 800, such as at the intermediate output node 208 or the DUT node 130.

In an example, the bias current controller 302 comprises a scaled copy of all or a portion of the circuitry that comprises the output stage 800. For example, the bias current controller 302 can include a one-eighth-scale copy of the output stage 800 circuitry. The bias current controller 302 includes the first control input 702 configured to receive a control signal for a current generator 816. The current generator 816 can include, for example, a current source (e.g., comprising a PTAT current generator) that provides a current signal that is within a specified range of current signal magnitudes, such as between ⅛ and ¼ mA (e.g., corresponding to one-eighth of the expected 1 to 2 mA swing of the bias current for the push-pull output stage circuit 806, such as when the bias current controller 302 comprises a one-eighth copy of the output stage circuit). Accordingly, the controlled current provided by the smaller and lower power bias current controller 302 can be used to impose higher current main stage bias currents at the push-pull output stage circuit 806.

The output stage 800 further includes an example of the feedback controller 706, such as can be configured to deliver feedback current signals to respective base resistors of the first output transistor 808 and the second output transistor 810. In an example, the feedback controller 706 comprises a current-selectable DAC to monitor and respond to the current in the push-pull output stage circuit 806 by controlling a folded cascode amplifier to provide a feedback current signal to a base resistor. Using the folded cascode configuration helps ensure high output impedance, high gain, and high bandwidth of the feedback controller 706, which in turn allows the base resistors Rbasep and Rbasen to be small or low resistance (e.g., 100 ohms). Accordingly, the feedback loop implemented by the feedback controller 706 can be fast and responsive to changes in the DUT current at the DUT node 130. The transistor networks labeled with multiple 'y' devices comprise respective buffers configured to accept the high-speed feedback loop current and maintain a constant voltage on one side of each of the base resistors Rbasep and Rbasen.

The example of FIG. 8 shows one instance of the feedback controller 706, comprising an arrangement of NPN devices, coupled to the current sourcing side of the push-pull output stage circuit 806. A similar instance of the feedback controller 706, comprising an arrangement of PNP devices, can be coupled to the current sinking side of the push-pull output stage circuit 806.

In operation, an optimum state of the output stage 800 can be achieved whereby the output impedance (e.g., at the DUT node 130) is substantially independent of the DUT current at the DUT node 130, including for various amounts of sinking or sourcing DUT currents. Respective first voltages can be produced by the feedback current signals from the feedback controller 706 imposed on each base resistor. A second voltage can be produced by the DUT current imposed on the incremental impedance of the transistors in the push-pull output stage circuit 806, and the incremental impedance can be a function of the bias current imposed by the bias current controller 302. The optimum state can occur when the first and second voltages are substantially equal.

Various modifications to the output stage 800 can be made to adjust the amount of trim range for the output impedance of the push-pull output stage circuit 806, or to adjust the bandwidth of the output stage 800. For example, more trim range can be achieved by increasing the resistance value of base resistors Rbasep and Rbasen. However, such increases in resistance can reduce an overall bandwidth of the output stage 800, and can reduce a bandwidth or speed of the feedback controller 706 which, in turn, can cause settling tails or errors in some operating conditions.

In an example, more trim range can be achieved by increasing the gain of the feedback controller 706 or the magnitude of the feedback control signals. However, increasing the gain can disturb the upstream driver circuitry (i.e., preceding the base resistors Rbase in the signal chain), can require physically larger devices in the feedback controller 706, and can consume more power. In an example, more trim range can be achieved by reducing a minimum value of the bias current in the output transistors, however, this leads to bandwidth limitations at low bias currents.

In an example, an overall bandwidth of the output stage 800 can be increased by reducing the resistance characteristics of the base resistors Rbasep and Rbasen, and reducing the gain of the feedback controller 706. However, such changes can impact the stability of the output impedance characteristic of the push-pull output stage circuit 806. As can be seen, optimizing the output stage 800 depends on balancing these and other competing considerations.

Figure 9:
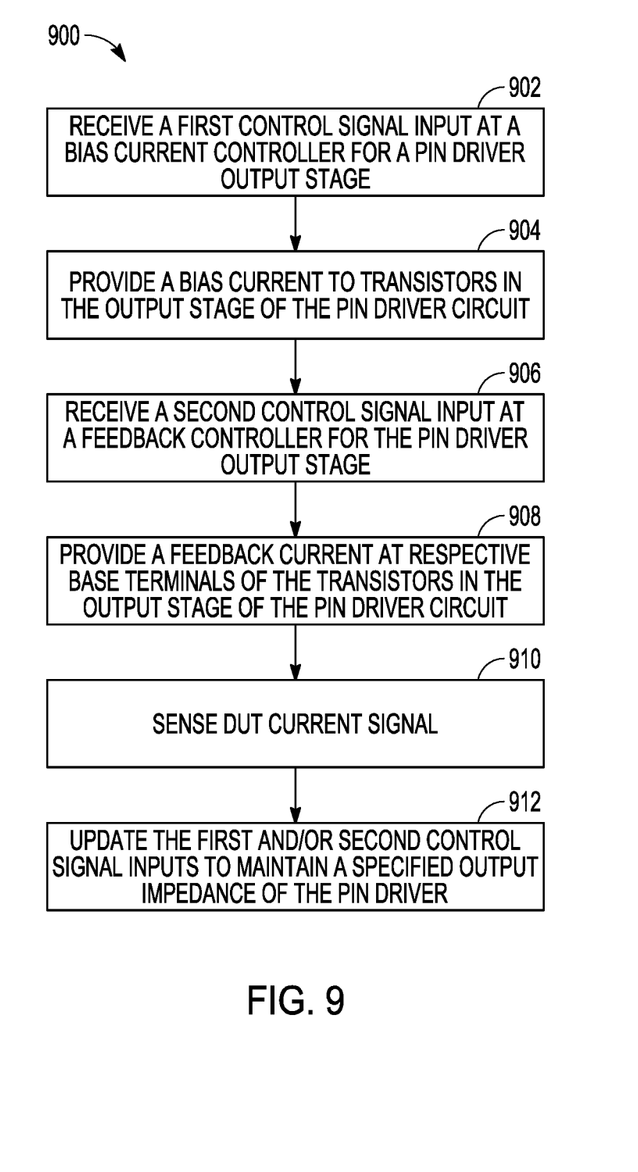
FIG. 9 illustrates generally an example of a method for adjusting a characteristic output impedance of an output stage of a pin driver circuit.

FIG. 9 illustrates generally an example of a method 900 that includes using a bias current controller and a feedback controller in an output stage of a pin driver circuit. In an example, the method 900 includes or uses the bias current controller 302 and the feedback controller 706 to change an output impedance characteristic of the output stage of the pin driver circuit to ensure the pin driver circuit provides an impedance-stable load (e.g., 50 ohms) at a DUT interface.

At operation 902, the method 900 can include receiving a first control signal input at a bias current controller, such as the bias current controller 302. The first control signal input can include an analog or digital control signal provided by a user or other control system, and configured to update or adjust an output impedance magnitude characteristic of the output stage of the pin driver circuit. The output impedance magnitude corresponds to an impedance at an output node of the pin driver, for example, at or coupled to emitter terminals of transistors in the output stage.

At operation 904, in response to receiving the first control signal input, the bias current controller 302 can be configured to provide a bias current to the transistors in the output stage of the pin driver circuit, wherein a magnitude of the bias current corresponds to a value of the first control signal input. For example, at operation 904, the bias current controller 302 can control a differential voltage imposed across transistors in a class AB, push-pull output stage to thereby change a magnitude of the bias current in the transistors. In an example, operation 904 includes using a scaled replica of the output stage to produce the voltage signal that causes the bias current to flow through the output transistors of the output stage.

At operation 906, the method 900 can include receiving a second control signal input at a feedback controller, such as the feedback controller 706. The second control signal input can include an analog or digital control signal provided by a user or other control system, and configured to update or adjust the impedance magnitude characteristic of the output stage of the pin driver circuit. At operation 908, in response to receiving the second control signal input, the feedback controller 706 can be configured to provide feedback current signals at respective base terminals of the transistors in the output stage of the pin driver circuit. In an example, the feedback current signals are imposed upon respective base resistors that are coupled to the base terminals of the transistors in the push-pull output stage. In an example, a magnitude of the feedback current signals corresponds to a value of the second control signal input.

In an example, the method 900 can include sensing a DUT current signal at operation 910. Operation 910 can include sensing a direction or magnitude of the DUT current signal. If the DUT current signal changes in direction or magnitude, then, at operation 912, the output stage 800 can include updating or changing at least one of the first control signal input or the second control signal input to maintain a specified output impedance characteristic (e.g., 50 ohms) for the pin driver.

Various aspects of the present disclosure can help provide a solution to the test system-related problems identified herein, as set forth in the following Examples. Example 1 can include a pin driver circuit comprising: a push-pull output stage circuit comprising output transistors configured to accommodate bidirectional current signals at an output node; a bias current controller configured to adjust a bias current provided to the output transistors of the output stage circuit to correspondingly adjust an impedance characteristic of the output stage circuit at the output node; first and second resistors coupled to respective base terminals of the output transistors; and a feedback circuit configured to selectively provide a feedback current signal to the first and second resistors to adjust the impedance characteristic of the output stage circuit at the output node.

In Example 2, the subject matter of Example 1 includes the impedance characteristic of the output stage circuit at the output node is substantially independent of a magnitude of the bidirectional current signals at the output node.

In Example 3, the subject matter of Example 2 includes: the feedback current signal is imposed on the first and second resistors to provide a first voltage; the bidirectional current signals impose a second voltage at an incremental impedance of the of the output transistors; and the impedance characteristic of the output stage circuit at the output node is substantially independent of the magnitude of the bidirectional current signals at the output node when the first and second voltages have the same magnitude.

In Example 4, the subject matter of Examples 1-3 includes a magnitude of the feedback current signal is less than a magnitude of a current signal at the output node.

In Example 5, the subject matter of Examples 1-4 includes the magnitude of the feedback current signal is a function of the magnitude of the current signal at the output node and an output impedance tuning parameter.

In Example 6, the subject matter of Examples 1-5 includes a data input configured to receive an output impedance tuning parameter that indicates a magnitude of the bias current and the magnitude of the feedback current signal.

In Example 7, the subject matter of Examples 1-6 includes the bias current controller is configured to change a magnitude of the bias current in coordination with a change in magnitude of the feedback current signal.

In Example 8, the subject matter of Examples 1-7 includes the bias current controller comprises a scaled-down replica circuit of the push-pull output stage circuit.

In Example 9, the subject matter of Examples 1-8 includes the feedback circuit comprises a first folded cascode amplifier circuit that provides a first feedback current signal to the first resistor, and a second folded cascode amplifier circuit that provides a second feedback current signal to the second resistor.

In Example 10, the subject matter of Examples 1-9 includes a fixed-value polysilicon resistor coupled between the output node of the output stage circuit and a device under test (DUT) node.

In Example 11, the subject matter of Example 10 includes degeneration resistors coupled between emitter terminals of the output transistors and the output node.

Example 12 is a system comprising: a comparator circuit coupled to a device under test (DUT) node; an active load coupled to the DUT node; and an output stage circuit coupled to the DUT node, the output stage circuit configured to provide, at the DUT node, a specified impedance characteristic that is substantially invariant over a specified range of DUT currents, wherein the output stage circuit comprises: a class AB driver circuit; a bias current controller configured provide, based on a first control input, a bias current for output transistors of the driver circuit; and a feedback controller configured to provide, based on a second control input, a feedback current at respective base terminals of the output transistors of the driver circuit.

In Example 13, the subject matter of Example 12 includes, when the first control input indicates a minimum bias current for the output transistors of the driver circuit, the second control input indicates a maximum feedback current to thereby maintain the specified impedance characteristic for the output stage.

In Example 14, the subject matter of Examples 12-13 includes, when the first control input indicates a maximum bias current for the output transistors of the driver circuit, the second control input indicates a minimum feedback current or zero feedback current to thereby maintain the specified impedance characteristic for the output stage.

In Example 15, the subject matter of Examples 12-14 includes the first control input is a function of the second control input, or the second control input is a function of the first control input.

In Example 16, the subject matter of Examples 12-15 includes the output stage circuit comprises an output resistor coupled between the DUT node and an output node of the output transistors.

In Example 17, the subject matter of Example 16 includes the class AB driver circuit comprises a push-pull output stage comprising the output transistors, wherein the output transistors comprise a first array of NPN transistors coupled at the output node to a second array of PNP transistors.

In Example 18, the subject matter of Examples 16-17 includes the class AB driver circuit comprises a push-pull output stage comprising the output transistors, wherein the output transistors comprise a first transistor coupled to the output node via a first degeneration resistor, and a second transistor coupled to the output node via a second degeneration resistor.

In Example 19, the subject matter of Examples 16-18 includes base resistors respectively coupled to base terminals of the output transistors, wherein the base resistors are configured to receive the feedback current from the feedback controller.

In Example 20, the subject matter of Examples 12-19 includes the bias current controller comprises a scaled-down replica of the class AB driver circuit.

In Example 21, the subject matter of Examples 12-20 includes a user interface configured to receive the first control input and the second control input from a user.

In Example 22, the subject matter of Examples 12-21 includes the output stage configured to provide, at the DUT node, a 50 ohm characteristic impedance.

Example 23 is a method for adjusting a characteristic output impedance of an output stage of a pin driver circuit, the method comprising: receiving a first control signal input at a bias current controller and, in response, providing a bias current to transistors in the output stage of the pin driver circuit, wherein a magnitude of the bias current corresponds to a value of the first control signal input; and receiving a second control signal input at a feedback controller and, in response, providing a feedback current at respective base terminals of the transistors in the output stage of the pin driver circuit, wherein a magnitude of the feedback current corresponds to a value of the second control signal input; wherein the characteristic output impedance corresponds to an impedance at an output node that is coupled to emitter terminals of the transistors in the output stage.

In Example 24, the subject matter of Example 23 includes providing the bias current to transistors in the output stage of the pin driver circuit comprising providing a bias current to transistors of a class AB push-pull output stage.

In Example 25, the subject matter of Examples 23-24 includes providing the feedback current at the respective base terminals of the transistors comprising providing the feedback current to resistors that are coupled to the respective base terminals of the transistors.

In Example 26, the subject matter of Examples 23-25 includes providing the bias current using a current source that comprises a scaled replica of the output stage.

In Example 27, the subject matter of Examples 23-26 includes receiving information about a magnitude of an output current signal at the output node and, in response, changing at least one of the value of the first control signal input or the value of the second control signal input to maintain the characteristic output impedance.

Example 28 is at least one machine-readable medium including instructions that, when executed by processing circuitry, cause the processing circuitry to perform operations to implement of any of Examples 1-27.

Example 29 is an apparatus comprising means to implement of any of Examples 1-27.

Example 30 is a system to implement of any of Examples 1-27.

Each of these non-limiting Examples can stand on its own, or can be combined in various permutations or combinations with one or more of the other Examples or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A pin driver circuit comprising:
a push-pull output stage circuit comprising output transistors configured to accommodate bidirectional current signals at an output node;
a bias current controller configured to adjust a bias current provided to the output transistors of the output stage circuit to correspondingly adjust an impedance characteristic of the output stage circuit at the output node;
first and second resistors coupled to respective base terminals of the output transistors; and
a feedback circuit configured to selectively provide a feedback current signal to the first and second resistors to adjust the impedance characteristic of the output stage circuit at the output node.

2. The pin driver circuit of claim 1, wherein the impedance characteristic of the output stage circuit at the output node is substantially independent of a magnitude of the bidirectional current signals at the output node.

3. The pin driver circuit of claim 2, wherein:
the feedback current signal is imposed on the first and second resistors to provide a first voltage;
the bidirectional current signals impose a second voltage at an incremental impedance of the of the output transistors; and
the impedance characteristic of the output stage circuit at the output node is substantially independent of the magnitude of the bidirectional current signals at the output node when the first and second voltages have the same magnitude.

4. The pin driver circuit of claim 1, wherein a magnitude of the feedback current signal is a function of the magnitude of the current signal at the output node and an output impedance tuning parameter.

5. The pin driver circuit of claim 1, comprising a data input configured to receive an output impedance tuning parameter that indicates a magnitude of the bias current and the magnitude of the feedback current signal.

6. The pin driver circuit of claim 1, wherein the bias current controller is configured to change a magnitude of the bias current in coordination with a change in magnitude of the feedback current signal.

7. The pin driver circuit of claim 1, wherein the bias current controller comprises a scaled-down replica circuit of the push-pull output stage circuit.

8. The pin driver circuit of claim 1, wherein the feedback circuit comprises a first folded cascode amplifier circuit that provides a first feedback current signal to the first resistor, and a second folded cascode amplifier circuit that provides a second feedback current signal to the second resistor.

9. The pin driver circuit of claim 1, comprising:
a fixed-value polysilicon resistor coupled between the output node of the output stage circuit and a device under test (DUT) node; and
degeneration resistors coupled between emitter terminals of the output transistors and the output node.

10. A system comprising:
a comparator circuit coupled to a device under test (DUT) node;
an active load coupled to the DUT node; and
an output stage circuit coupled to the DUT node, the output stage circuit configured to provide, at the DUT node, a specified impedance characteristic that is substantially invariant over a specified range of DUT currents, wherein the output stage circuit comprises:
a class AB driver circuit;
a bias current controller configured provide, based on a first control input, a bias current for output transistors of the driver circuit; and
a feedback controller configured to provide, based on a second control input, a feedback current at respective base terminals of the output transistors of the driver circuit.

11. The system of claim 10, wherein when the first control input indicates a minimum bias current for the output transistors of the driver circuit, the second control input indicates a maximum feedback current to thereby maintain the specified impedance characteristic for the output stage.

12. The system of claim 10, wherein when the first control input indicates a maximum bias current for the output transistors of the driver circuit, the second control input indicates a minimum feedback current or zero feedback current to thereby maintain the specified impedance characteristic for the output stage.

13. The system of claim 10, wherein the output stage circuit comprises an output resistor coupled between the DUT node and an output node of the output transistors, wherein the class AB driver circuit comprises a push-pull output stage comprising the output transistors, and wherein the output transistors comprise a first array of NPN transistors coupled at the output node to a second array of PNP transistors.

14. The system of claim 10, wherein the output stage circuit comprises an output resistor coupled between the DUT node and an output node of the output transistors, wherein the class AB driver circuit comprises a push-pull output stage comprising the output transistors, and wherein the output transistors comprise a first transistor coupled to the output node via a first degeneration resistor, and a second transistor coupled to the output node via a second degeneration resistor.

15. The system of claim 10, comprising base resistors respectively coupled to base terminals of the output transistors, wherein the base resistors are configured to receive the feedback current from the feedback controller, wherein the output stage circuit comprises an output resistor coupled between the DUT node and an output node of the output transistors.

16. A method for adjusting a characteristic output impedance of an output stage of a pin driver circuit, the method comprising:
receiving a first control signal input at a bias current controller and, in response, providing a bias current to transistors in the output stage of the pin driver circuit, wherein a magnitude of the bias current corresponds to a value of the first control signal input; and
receiving a second control signal input at a feedback controller and, in response, providing a feedback current at respective base terminals of the transistors in the output stage of the pin driver circuit, wherein a magnitude of the feedback current corresponds to a value of the second control signal input;
wherein the characteristic output impedance corresponds to an impedance at an output node that is coupled to emitter terminals of the transistors in the output stage.

17. The method of claim 16, wherein providing the bias current to transistors in the output stage of the pin driver circuit comprises providing a bias current to transistors of a class AB push-pull output stage.

18. The method of claim 16, wherein providing the feedback current at the respective base terminals of the transistors comprises providing the feedback current to resistors that are coupled to the respective base terminals of the transistors.

19. The method of claim 16, wherein providing the bias current includes using a current source that comprises a scaled replica of the output stage.

20. The method of claim 16, comprising receiving information about a magnitude of an output current signal at the output node and, in response, changing at least one of the value of the first control signal input or the value of the second control signal input to maintain the characteristic output impedance.

* * * * *